(12) United States Patent
Briggs

(10) Patent No.: US 7,883,940 B1
(45) Date of Patent: Feb. 8, 2011

(54) BALL GRID ARRAY INCLUDING REDISTRIBUTION LAYER, PACKAGED INTEGRATED CIRCUIT INCLUDING THE SAME, AND METHODS OF MAKING AND USING THE SAME

(75) Inventor: Randall D. Briggs, Boise, ID (US)

(73) Assignee: Marvell International Ltd., Hamilton (BM)

( * ) Notice: Subject to any disclaimer, the term of this patent is extended or adjusted under 35 U.S.C. 154(b) by 192 days.

(21) Appl. No.: 11/821,822

(22) Filed: Jun. 25, 2007

Related U.S. Application Data

(60) Provisional application No. 60/819,334, filed on Jul. 7, 2006.

(51) Int. Cl.
*H01L 21/82* (2006.01)

(52) U.S. Cl. ............... 438/129; 257/784; 438/106

(58) Field of Classification Search .......... 257/784; 438/106, 129
See application file for complete search history.

(56) References Cited

U.S. PATENT DOCUMENTS

2005/0059188 A1* 3/2005 Bolken et al. ............ 438/106
2005/0139985 A1* 6/2005 Takahashi ............... 257/698
2006/0220262 A1* 10/2006 Meyer et al. ............ 257/779
2006/0270104 A1* 11/2006 Trovarelli et al. ........ 438/106
2007/0069390 A1* 3/2007 Chen et al. .............. 257/777
2007/0262436 A1* 11/2007 Kweon et al. ........... 257/686

\* cited by examiner

*Primary Examiner*—Thao X Le
*Assistant Examiner*—Geoffrey Ida

(57) ABSTRACT

Method, algorithms, architectures, packages, circuits, and/or approaches for relatively low cost packaged integrated circuits (e.g., ball grid array or BGA packages) are disclosed. For example, a packaged integrated circuit can include a chip with a plurality of bond pads thereon; a plurality of bond pad connectors in electrical communication with the plurality of bond pads; a substrate having a plurality of layers, where at least one of the layers is configured to electrically connect a plurality of bond pad connectors and a plurality of external package connections; and a redistribution layer on the chip, where the redistribution layer is configured to electrically connect at least one of the bond pad connectors and at least one of the bond pads on the chip. Such an approach enables reductions in overall package costs. The RDL may complete an electrical path between one or more substrate traces and the corresponding bond pad(s) to avoid increasing the substrate layer count. Because substrate layers are typically provided in pairs, the advantages of the invention may be amplified when a relatively small number of connections (e.g., one) are made via an RDL on the chip.

23 Claims, 7 Drawing Sheets

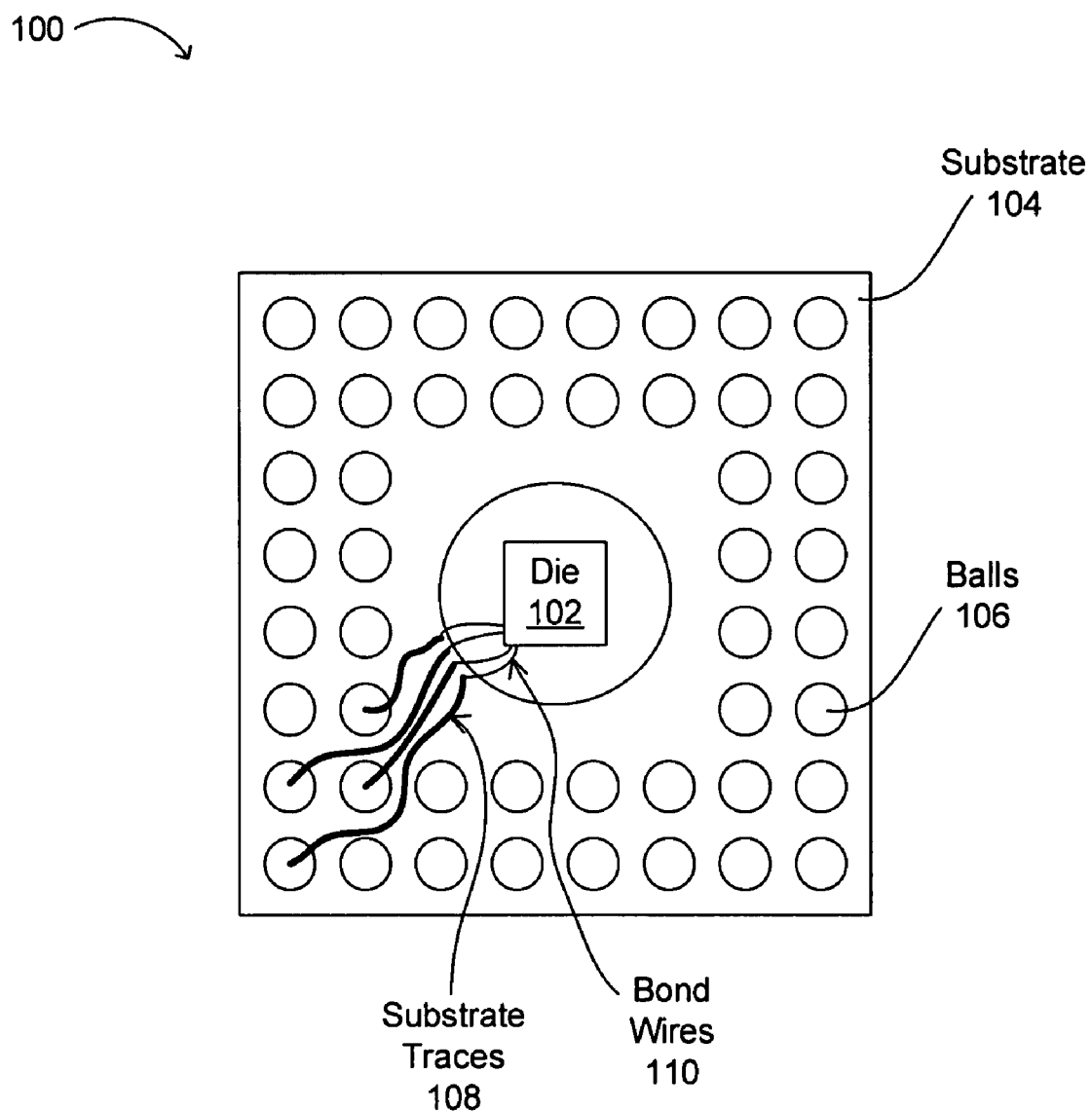
FIG. 1 (conventional)

BALL GRID ARRAY INCLUDING REDISTRIBUTION LAYER, PACKAGED INTEGRATED CIRCUIT INCLUDING THE SAME, AND METHODS OF MAKING AND USING THE SAME

RELATED APPLICATIONS

This application claims the benefit of U.S. Provisional Application No. 60/819,334, filed Jul. 7, 2006, which is incorporated herein by reference in its entirety.

FIELD OF THE INVENTION

The present invention generally relates to the field of integrated circuit packaging. More specifically, embodiments of the present invention pertain to methods, algorithms, architectures, packages, and/or approaches for using a redistribution layer in a packaged integrated circuit.

DISCUSSION OF THE BACKGROUND

Some integrated circuit (IC) packages, such as ball grid array (BGA) packages may include a substrate that can be similar to a very small printed-circuit board (PCB). Such a substrate may typically include a number of layers that are laminated together. For example, the substrate can be used to route signals from the "die" or "chip," or multiple chips, to the balls on the bottom of the BGA package for connection to the outside world (e.g., via a larger PCB). A conventional BGA package is shown in FIG. 1 and indicated by the general reference character 100. Die or chip 102 can have a number of bonding pads (not shown) for connection via bond wires 110. Substrate 104 can include substrate traces 108 for electrical connections from bond wires 110 to balls 106. Substrate traces 108 can reside in one or more routing layers of substrate 104.

The cost of a BGA substrate (e.g., substrate 104) may be directly correlated to the number of layers (e.g., for making or insulating substrate traces 108) used in the substrate. In such a BGA substrate, bond pads on an IC may be connected via substrate traces to the BGA balls, as shown. However, a substrate design or arrangement of substrate traces (e.g., 108) in relation to external connections (e.g., balls 106) and bond pad connectors (e.g., bond wires 110) can sometimes be difficult. For example, it may be difficult to route some traces 108 without crossing or overlapping another trace 108 or a ball 106.

Among the factors or design considerations adding to this difficulty are the number of connections to be made, the size of the BGA substrate, the BGA ball assignment and geometric pattern, and the IC signal assignment or bond pad locations on the chip. For example, it may be necessary at times to electrically connect a bond pad on one side of the die 102 to a ball 106 at a remote location (e.g., an opposite side) of the substrate 104. Often, it may be necessary to increase the number of layers in the BGA or other such package substrate in order to successfully route the IC signals (e.g., from the bond pads on the chip) to the BGA balls (e.g., 106), and this generally adds expense to the BGA package.

Accordingly, one drawback of conventional approaches for BGA or other IC package substrates is the additional cost associated with adding more layers to complete routing via the substrate traces. As such, a substrate having fewer layers may generally be less expensive than a comparable substrate with a relatively large number of layers. Thus, it would be desirable to have a method and apparatus that reduces or minimizes the number of layers used in an IC package substrate.

SUMMARY OF THE INVENTION

Embodiments of the present invention relate to methods, algorithms, architectures, packages, circuits, and/or approaches for relatively low cost IC package designs.

In one embodiment, a packaged integrated circuit can include a first chip having a plurality of bond pads thereon; a plurality of bond pad connectors in electrical communication with the plurality of bond pads; a substrate having a plurality of layers, where at least one of the plurality of layers is configured to electrically connect at least a first subset of the plurality of bond pad connectors and a plurality of external package connections; and a redistribution layer (RDL) on the first chip, where the redistribution layer is configured to electrically connect at least one of the plurality of bond pad connectors and at least one of a plurality of bond pads on the first chip. The plurality of bond pad connectors can include bond wires, for example. Also, the package type can be a ball grid array (BGA) or a leadless chip carrier (LCC), for example. Further, the package may include multiple integrated circuits or chips in a multi-chip module (MCM) configuration.

In another embodiment, a method of electrically connecting bond pads on a first chip to external package connections in an integrated circuit, can include the steps of routing a plurality of traces on one or more substrate layers, where the traces are configured to electrically connect a plurality of bond pad connectors and the external package connections; forming a redistribution layer (RDL) on top of the first chip; and connecting the plurality of bond pad connectors to the bond pads and the redistribution layer. In this fashion, the number of layers used in the package substrate can be reduced.

In another embodiment, a method of making a packaged integrated circuit can include the steps of forming one or more redistribution layers (RDLs) on top of a chip; forming a plurality of traces on one or more substrate layers; and forming electrical connections between the plurality of traces and a plurality of bond pads on the chip and the one or more redistribution layers. Bond pad connectors (e.g., bond wires) can be used to make the connections between a substrate trace and a bond pad, or a substrate trace and an RDL.

Embodiments of the present invention can advantageously provide a substrate (e.g., a BGA substrate) with fewer layers relative to a comparable substrate by using a redistribution layer on the integrated circuit to facilitate routing of signals between one or more bond pads and the corresponding external package connections. Thus, such an approach may be less expensive than a corresponding substrate that does not use a redistribution layer for such signal routing. These and other advantages of the present invention will become readily apparent from the detailed description of preferred embodiments below.

BRIEF DESCRIPTION OF THE DRAWINGS

FIG. 1 is a diagram showing a conventional substrate in a ball grid array (BGA) type package.

DETAILED DESCRIPTION OF THE PREFERRED EMBODIMENTS

Figure 2:
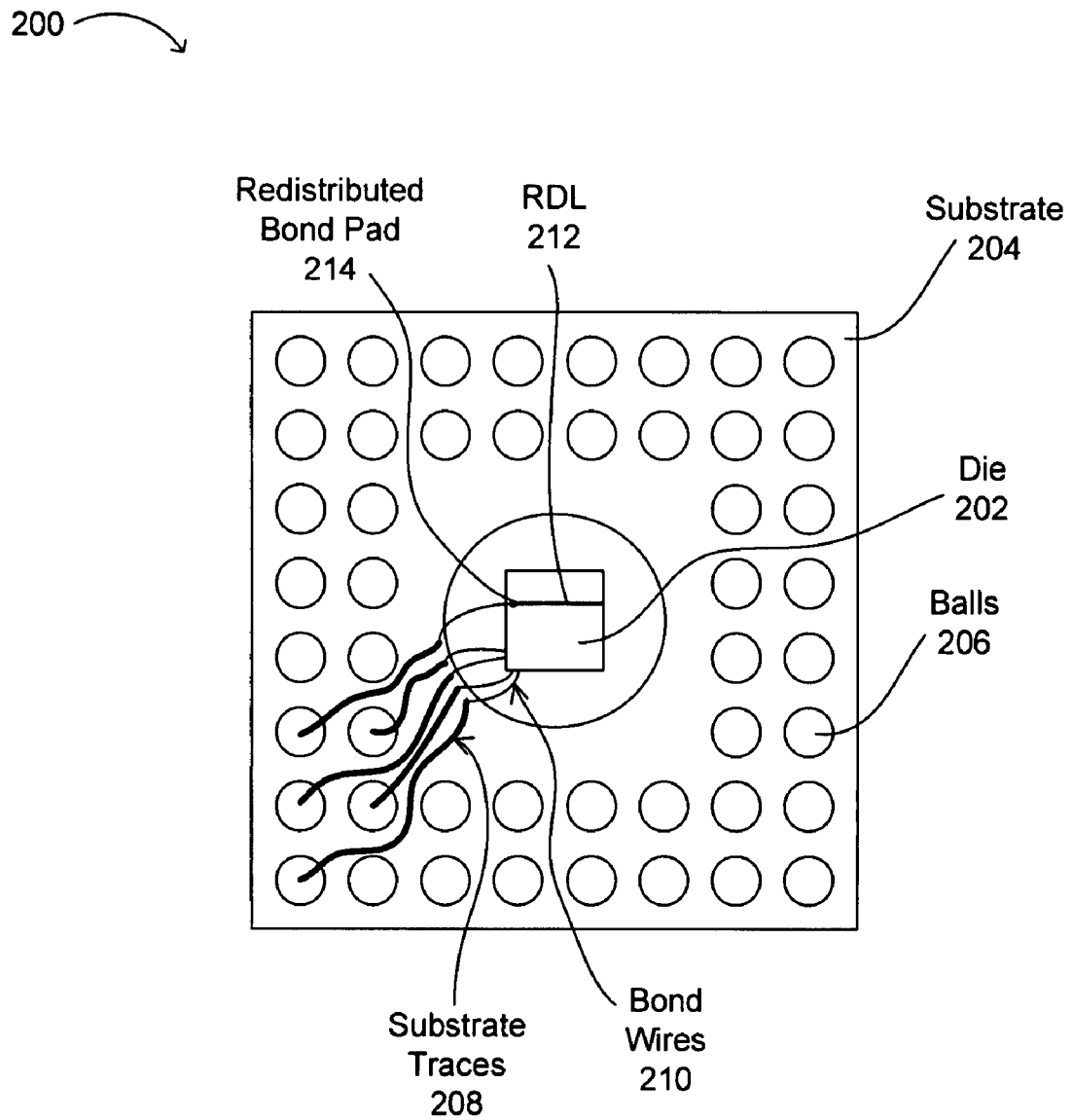
FIG. 2 is an exemplary BGA package showing use of a redistribution layer (RDL) in accordance with embodiments of the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor," "trace" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use. Similarly, for convenience and simplicity, the terms "data," "data stream," "waveform" and "information" may be used interchangeably, as may the terms "connected to," "coupled with," "coupled to," and "in communication with," (which may refer to direct or indirect connections, couplings, or communications) but these terms are generally given their art-recognized meanings herein.

Embodiments of the present invention relate to methods, algorithms, architectures, packages, circuits, and/or approaches for a relatively low cost IC package, such as ball grid array (BGA), designs. For example, a packaged integrated circuit can include a first chip having a plurality of bond pads thereon; a plurality of bond pad connectors in electrical communication with the plurality of bond pads; a substrate having a plurality of layers, where at least one of the plurality of layers is configured to electrically connect at least a first subset of the plurality of bond pad connectors and a plurality of external package connections; and a redistribution layer (RDL) on the first chip, where the redistribution layer is configured to electrically connect at least one of the plurality of bond pad connectors and at least one of a plurality of bond pads on the first chip. The plurality of bond pad connectors can include bond wires, for example. Also, the package type can be a ball grid array (BGA) or a leadless chip carrier (LCC), for example. Further, the package may include multiple integrated circuits or chips in a multi-chip module (MCM) configuration.

In another aspect of the invention, a method of electrically connecting bond pads on a first chip to external package connections in an integrated circuit can include the steps of routing a plurality of traces on one or more substrate layers, where the traces are configured to electrically connect a plurality of bond pad connectors and the external package connections; forming a redistribution layer (RDL) on top of the first chip; and connecting the plurality of bond pad connectors to the bond pads and the redistribution layer. In this fashion, the number of layers used in the package substrate can be reduced.

In another aspect of the invention, a method of making a packaged integrated circuit including a chip can include the steps of forming a plurality of traces on one or more substrate layers; forming a redistribution layer (RDL) on top of the chip; and electrically connecting the plurality of traces to a plurality of bond pads on the chip and the redistribution layer.

Bond pad connectors (e.g., bond wires) can be used to make the connections between a substrate trace and a bond pad, or a substrate trace and an RDL.

The invention further relates to hardware implementations of the present package, arrangement, method and circuit. Embodiments of the present invention can advantageously provide a substrate (e.g., a BGA substrate) with fewer layers relative to a comparable substrate by using a redistribution layer on the integrated circuit. Thus, such an approach may generally be less expensive than a corresponding substrate without the use of such a redistribution layer. The invention, in its various aspects, will be explained in greater detail below with regard to exemplary embodiments.

According to various embodiments of the present invention, a packaged integrated circuit (IC) chip or die includes a redistribution layer (RDL) on the chip. The RDL can be configured to facilitate routing of signals between one or more bond pads on a chip and the corresponding external package connections, thereby enabling a reduction in or limitation of the number of routing layers in a substrate for the package. Such an approach can allow for a reduction in overall package costs. The RDL may complete an electrical path between one or more substrate connections and the corresponding bond pad(s) to avoid increasing the substrate layer count. In many cases, an RDL configured to facilitate a particular connection may be less expensive than an increase in the number of layers in the BGA substrate to make that same connection. Further, because substrate layers are typically provided in pairs, the advantages of the invention may be amplified when a relatively small number of connections (e.g., one) are made via an RDL on the chip.

An Exemplary Packaged Integrated Circuit

An exemplary packaged integrated circuit includes at least one chip having a plurality of bond pads thereon; a substrate with a plurality of layers, where at least one of the plurality of layers can electrically connect a plurality of bond pad connectors and a plurality of external package connections, where a first subset of the bond pad connectors are connected to at least a subset of the plurality of bond pads; and a redistribution path including a redistribution layer (RDL) on one of the chips, where the redistribution layer can electrically connect at least a first one of the plurality of bond pad connectors not in the first subset of bond pad connections and at least one of a plurality of bond pads on the chip having the RDL thereon. The plurality of bond pad connectors can include bond wires, for example. Also, the package type can be a ball grid array (BGA) or a leadless chip carrier (LCC), for example. Further, the package may include multiple integrated circuits or chips in a multi-chip module (MCM) configuration.

In various embodiments, the redistribution layer comprises a gold trace, and/or the bond pad connectors each comprise a bond wire. In one implementation, the redistribution layer is configured to electrically connect a bond pad on one side of the chip to a bond pad connector on another side of the chip. As explained herein, the redistribution layer may be configured to maintain the plurality of layers in the packaging substrate to less than or equal to a predetermined number.

In one embodiment, chip bond pads may be effectively (or electrically) relocated to a position where the bond pads can be "down-bonded" to the substrate in a more desirable location, or to a location facilitating less difficult substrate trace routing. In another embodiment, where direct routing of an RDL across a chip is not advantageous or possible, one or more signals can be routed from the bond pad to the BGA substrate, then from the BGA substrate back up to an RDL on the die at a different location, to the other side of the die along the RDL, and finally back down to the substrate in a more advantageous location for substrate trace routing. Further, signals may be routed across a chip using an RDL that may not actually connect to or relate to a bond pad on the particular chip on which the RDL is routed, such as may be the case where multiple chips are included in the BGA (e.g., in an MCM).

In accordance with embodiments of the present invention, a chip bond pad may be effectively relocated to reduce the number of layers in a packaging substrate (e.g., a BGA substrate). Further, embodiments of the present invention can utilize an RDL to provide routing of the BGA substrate signals across a chip or die.

Referring now to FIG. 2, an exemplary BGA package showing use of a redistribution layer (RDL) in accordance with embodiments of the present invention is indicated by the general reference character 200. Die or chip 202 can have a number of bonding pads (not shown) for connection via bond wires 210. Substrate 204 can include substrate traces 208 for connections from bond pad connectors (e.g., bond wires) 210 to external package connections or balls 206. Such a substrate may include a number of layers that are laminated together. As discussed above, the substrate is generally used to route signals (via substrate traces) from the die or chip (e.g., die 202) to the balls (e.g., balls 206) on the bottom of the BGA package for connection to the outside world, such as via a larger printed-circuit board (PCB).

Also as discussed above, the cost of the BGA substrate may be directly correlated to the number of layers used in the substrate. In designing a BGA substrate, the chip bond pads may be routed via substrate traces (e.g., 208) to connect to BGA balls 206, as shown. However, such substrate trace routing paths can sometimes be relatively difficult depending on the number of connections to be made, the size of the BGA substrate, the BGA ball assignment and geometric pattern, and the chip bond pad signal assignment or location. Thus, conventional approaches typically increase the number of layers in the BGA substrate in order to successfully route the chip signals to the BGA balls, and this may add expense to the BGA package.

However, in the particular example of FIG. 2, redistributed bond pad 214 may be created on another side of die 202 from the bond pad's actual location. Accordingly, RDL 212 can essentially "relocate" a bond pad (e.g., redistributed bond pad 214) for connection via a bond wire (e.g., 210) to a substrate trace (e.g., 208). RDL 212 may be formed by depositing one or more gold conductive traces on top of die 202, for example. Also, such bond pad relocation may be made to any suitable position or location on die 202 to relieve substrate trace congestion or to solve problems that may arise in routing substrate traces 208. Thus, such bond pad relocation may not necessarily involve relocation to another side of the chip as shown in the particular example of FIG. 2.

Figure 3:
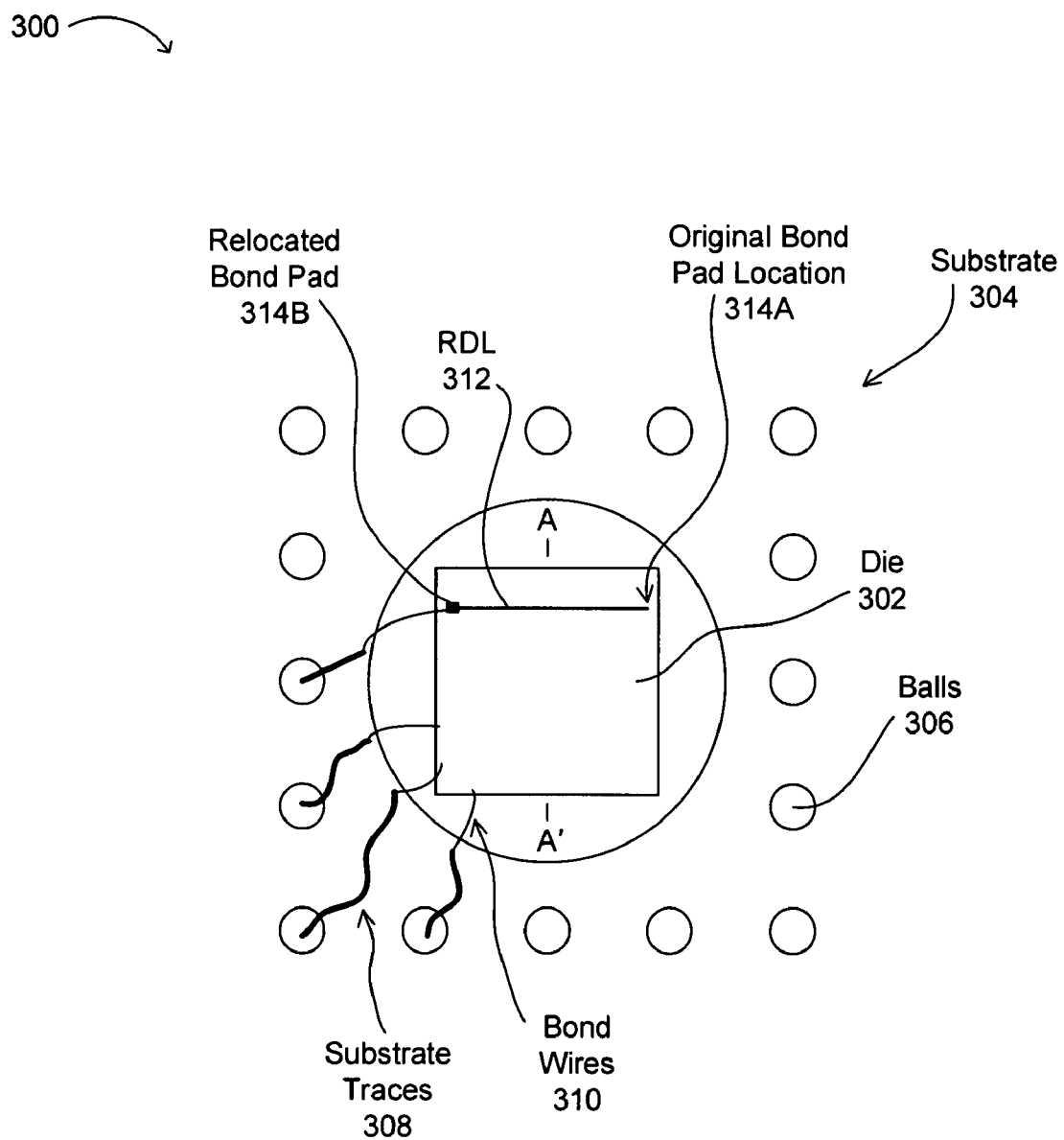
FIG. 3 is an exemplary close-up view of an RDL in a BGA package in accordance with embodiments of the present invention.

FIG. 3 shows an exemplary close-up view of an RDL in a BGA package in accordance with embodiments of the present invention, and is indicated by the general reference character 300. In this close-up view, only an illustrative number of balls 306 are shown. Of course, a typical BGA package may include substantially more balls, as is known in the art. Die 302 can have a number of bonding pads, such as one at original bond pad location 314A, for connection via bond wires 310. Substrate 304 can include substrate traces 308 for connections from bond wires 310 to external package connections or balls 306. In this example, RDL 312 can essentially relocate a bond pad (e.g., from original bond pad location 314A to relocated bond pad 314B) to facilitate a connection via a bond wire to a substrate trace.

In some embodiments, RDL 312 may be configured to electrically connect a bond pad at a location 314A on one side of the 302 chip to a bond pad connector 310 on another side of the chip 302. For example, one may arbitrarily bisect the die 302 horizontally, vertically (e.g., along axis A-A') or diagonally to define side regions of the die 302. Alternatively, one may bisect the die 302 horizontally and vertically to define four corner regions (where one may route RDL 312 from one corner region to another, or opposite, corner region), or twice diagonally (e.g., according to an "X" pattern on die 302) to define four side regions. The RDL 312 can thus electrically connect a bond pad on one side or in one region of die 302 to a bond wire 310 and substrate trace 308 on another side or region of die 302.

In some implementations, only a relatively small number of signals may be "re-routed" using an RDL. Typically, however, in completing a difficult substrate trace route, only a few of the more troublesome signals (i.e., those having more constrained routing paths) may remain to be routed using an RDL. Thus, limiting the RDL usage to only a relatively small number of signals does not significantly reduce the benefit of the present invention.

Figure 4:
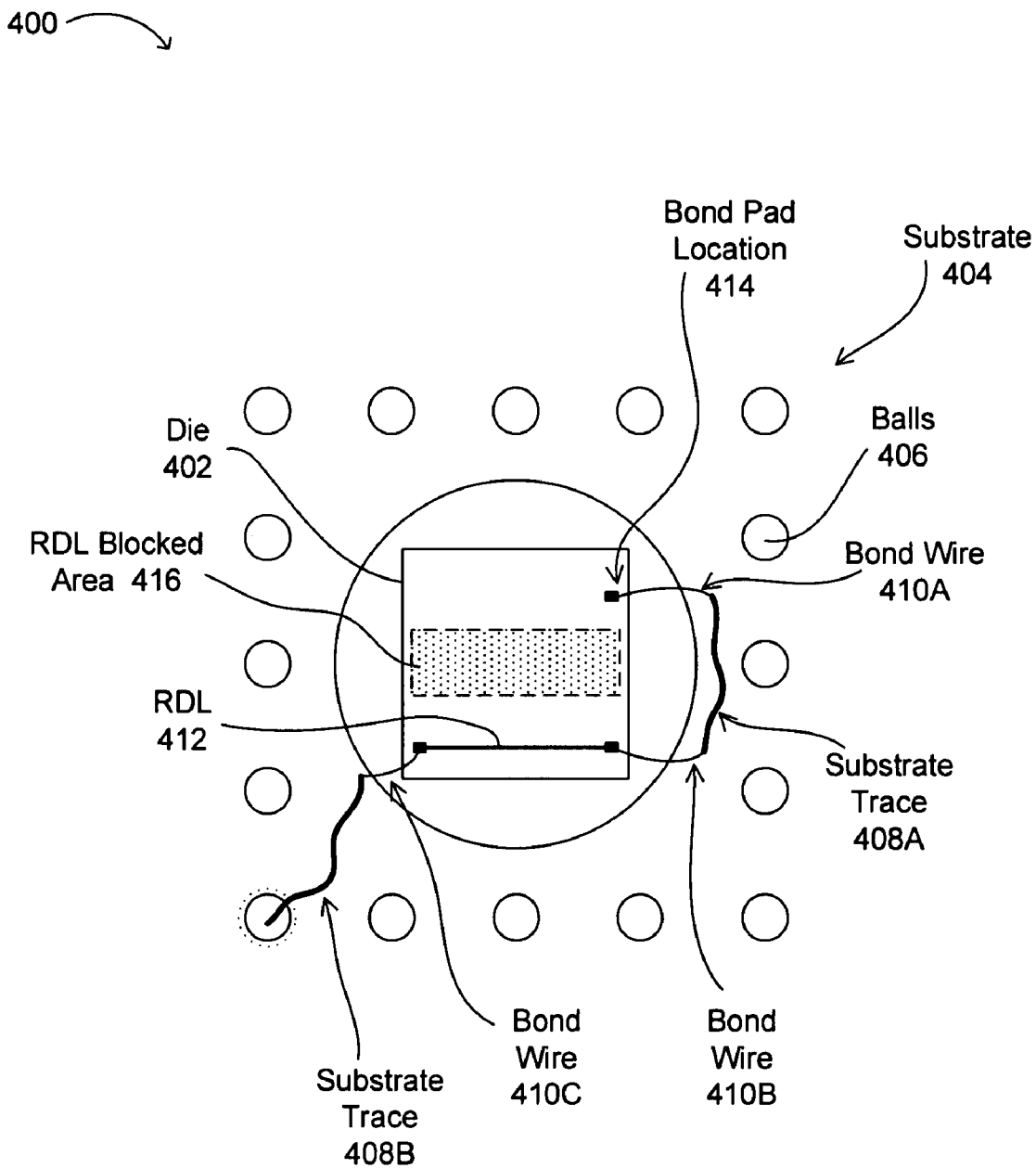
FIG. 4 is an exemplary alternate use of an RDL in a BGA package in accordance with embodiments of the present invention.

Referring now to FIG. 4, an exemplary alternate use of an RDL in a BGA package in accordance with embodiments of the present invention is indicated by the general reference character 400. Again, only an illustrative number of balls 406 are shown as a representative sample, but a typical BGA package may include substantially more balls. Die 402 can have a number of bond pads, such as one at bond pad location 414, for connection via bond pad connectors or bond wires 410. Here, an area 416 may be blocked from particular RDL usage. For example, RDL blocked area 416 may contain other RDL routings, and may thus not be available for routing a particular signal or another path using RDL.

Substrate 404 can include substrate traces 408A and 408B. As shown, a connection can be made from bond pad location 414, via a bond wire 410A, to substrate trace 408A, to another bond wire 410B, to RDL 412, to another bond wire 410C, to substrate trace 408B, and then to one of balls 406 (shown as a dashed circle around a ball 406). In this particular example, RDL 412, along with substrate trace 408A, can allow for a bond pad relocation (e.g., from bond pad location 414, as shown) to facilitate a connection via a bond wire to substrate trace 408B. Thus, the relocation path may comprise a first bond pad connector (e.g., 410C), electrically connected to redistribution layer 412 on the chip 402 and to a substrate trace 408B, a second bond pad connector (e.g., 410B), electrically connected to redistribution layer 412 and to a substrate trace 408A, and a third bond pad connector (e.g., 410A), electrically connected to substrate trace 408A and to a bond pad at location 414.

Figure 5:
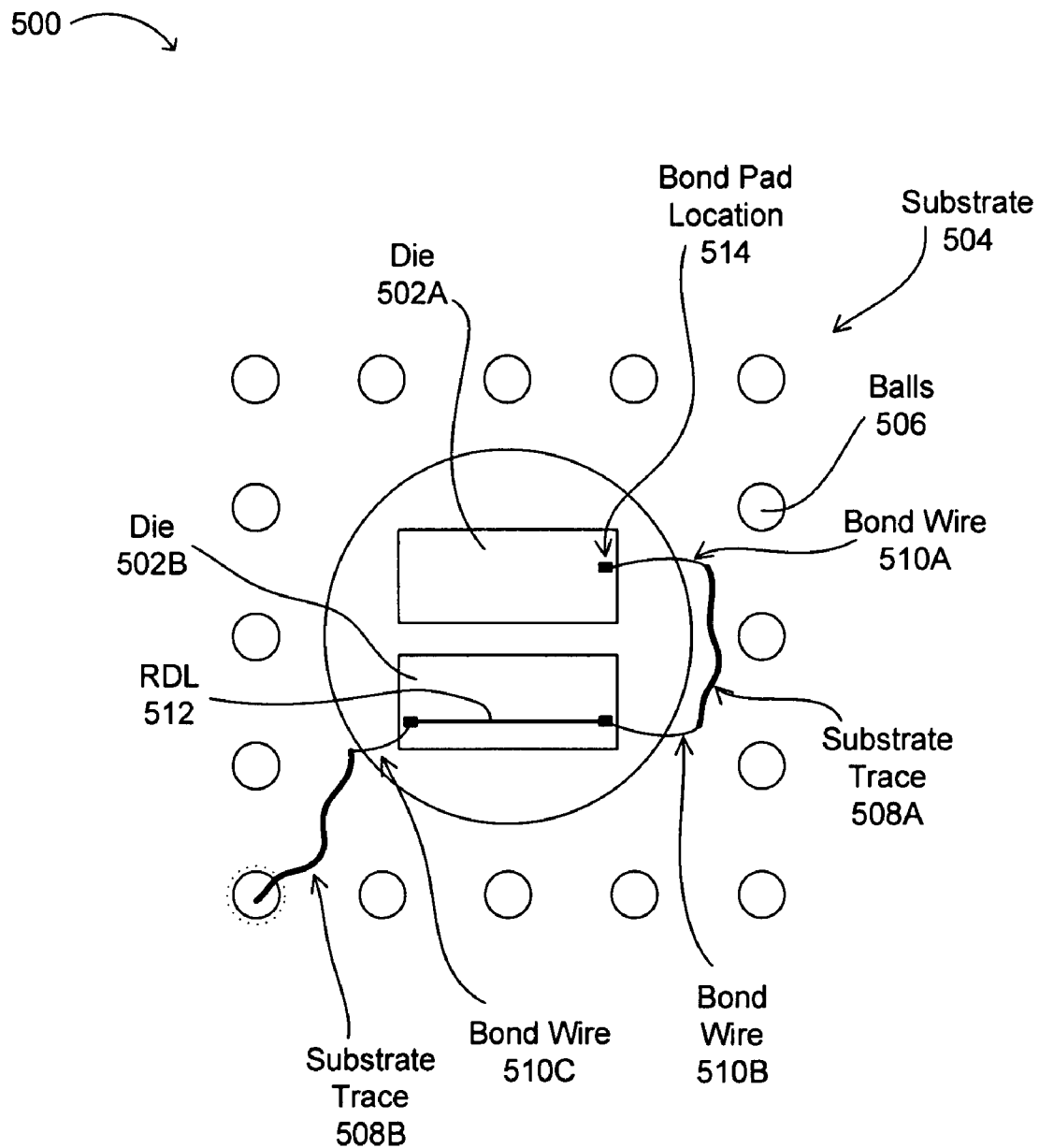
FIG. 5 is an exemplary RDL use in a multi-chip module (MCM) in accordance with embodiments of the present invention.

Referring now to FIG. 5, an exemplary RDL use in an MCM configuration in accordance with embodiments of the present invention is indicated by the general reference character 500. Again, only an illustrative number of balls 506 are shown as a representative sample, but a typical BGA package may include substantially more balls. MCM or package 500 can include die 502A and die 502B, each of which can have a number of bonding pads (e.g., one at bond pad location 514 for die 502A) for connection via bond wires 510. Substrate 504 can include substrate traces (e.g., 508A and 508B) for connections from bond wires 510 to external package connections or balls 506.

As shown in this particular example, a connection can be made from bond pad location 514 on die 502A, via a bond wire 510A, to substrate trace 508A, to another bond wire 510B, to RDL 512 on die 502B, to another bond wire 510C, to substrate trace 508B, and then to one of balls 506 (shown as a dashed circle around a ball 506). In this particular example, RDL 512, along with substrate trace 508A, can allow for a connection from a bond pad on one chip to a BGA ball using an RDL on another chip in an MCM configuration.

Thus, the present packaged integrated circuit may comprise first and second chips, in which case the relocation path may comprise first and second bond pad connectors connected to the redistribution layer on one of the chips (e.g., the first chip), and a substrate trace (e.g., 508A) configured to connect one of the first and second bond pad connectors to a third bond pad connector in electrical contact (directly or via a second RDL) with the bond pad. In one embodiment, the bond pad (and, when present, the second RDL) is on another (e.g., the second) chip.

Exemplary Method of Packaging a Chip

A first step in an exemplary method of electrically connecting bond pads on a chip to external package connections in an integrated circuit can include routing a plurality of traces on one or more substrate layers configured to electrically connect a plurality of bond pad connectors and the external package connections. Next, the exemplary method can include forming a redistribution layer on the chip. Finally, the exemplary method may include connecting the plurality of bond pad connectors to the bond pads and the redistribution layer. In this fashion, the number of layers used in the package substrate can be reduced.

In general, the step of routing said plurality of traces comprises forming a plurality of traces on one (or several) of the substrate layers, each trace connecting a bond pad connector location to one of the external package connections. In various embodiments, the external package connections may comprise a ball grid array (BGA), or one (or more) of the substrate layers may comprise a leadless chip carrier (LCC).

In one embodiment, each of the bond pad connectors comprises a bond wire. Thus, connecting the plurality of bond pad connectors to the bond pads and the redistribution layer may comprise wire bonding an end of the bond wire to a bond pad or to a wire bonding location on the redistribution layer. Naturally, the wire bonds may be conventionally wire bonded to locations on the substrate traces.

As described above, forming the redistribution layer may comprise forming one or more gold traces on the top surface of the chip, and the step of forming the redistribution layer may comprise routing the redistribution layer between a bond pad on one side or in one region of the chip to a bonding location on another side or in another region of the chip. Also, where the redistribution layer may route a signal from one side of a substrate, across a chip to another (or opposite) side of the substrate, connecting the bond pad connectors to the redistribution layer may comprise connecting first and second bond pad connectors (e.g., wire bonds) to first and second ends of the redistribution layer, respectively. In such a case, signal routing from the output terminal (e.g., BGA solder ball) to the redistribution layer comprises connecting the bond pad connectors to the bond pad(s) may comprise connecting the first bond pad connector between a first trace (connected to the solder ball) and a first end of the redistribution layer, connecting the second bond pad connector between an opposite end of the redistribution layer and one end of a second trace, and connecting a third bond pad connector to an opposite end of the second trace and to the bond pad(s). When the packaged integrated circuit comprises first and second chips, the RDL may be on the first chip, and the bond pad(s) may be on the second chip. In either case, the second trace may be configured to facilitate placement of the redistribution layer to avoid an area on the chip that is unavailable for the redistribution layer.

Figure 6:
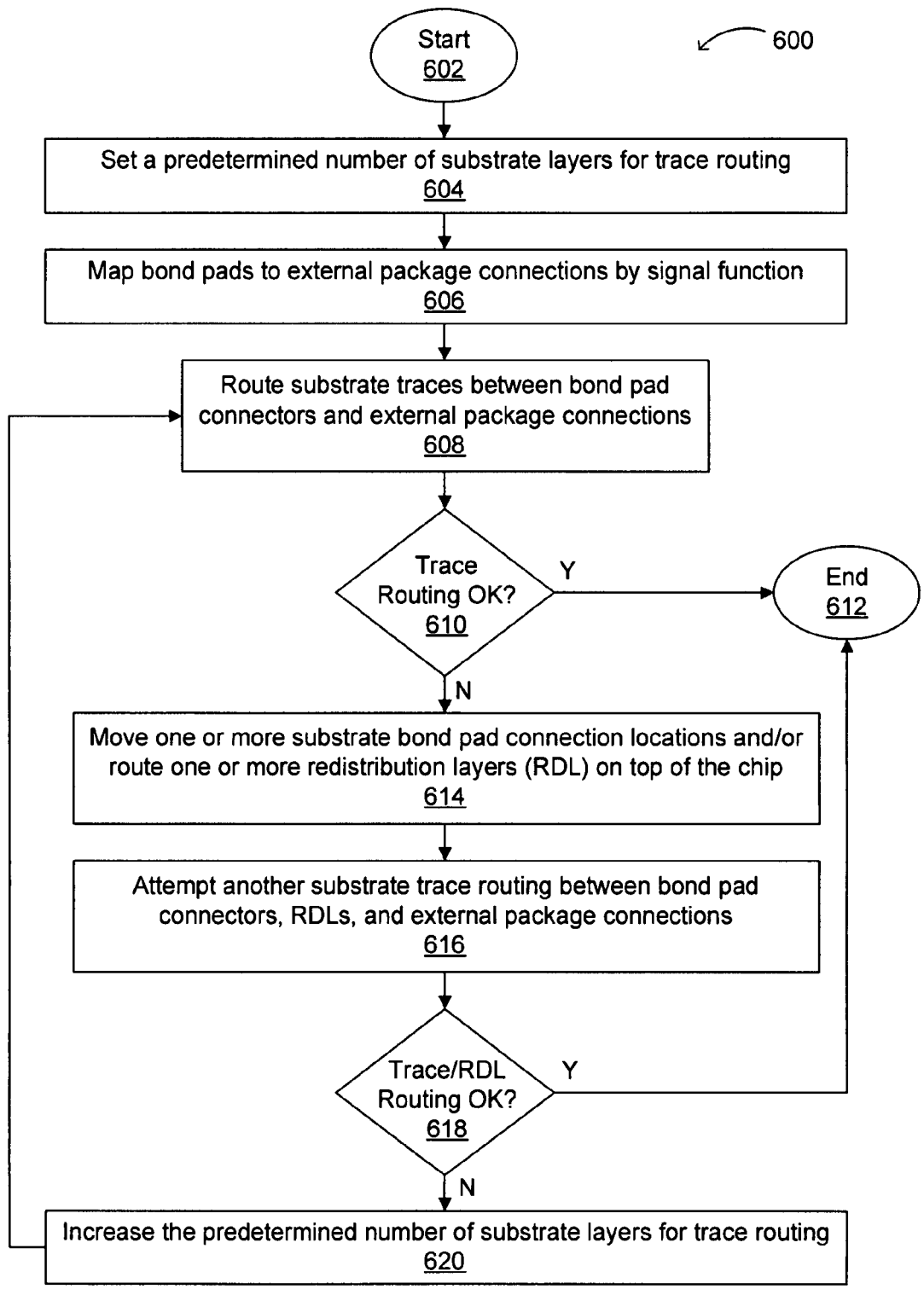
FIG. 6 is a flow diagram showing an exemplary method of using an RDL to limit a number of package substrate layers in accordance with embodiments of the present invention.

Referring now to FIG. 6, a flow diagram 600 shows an exemplary method of using an RDL to facilitate routing in packaging substrates and/or to limit the number of substrate layers in a package in accordance with embodiments of the present invention. The flow can begin (602) and a predetermined number of substrate layers for trace routing can be set (604). Typically, this predetermined number can be initially set at 2 layers, where a first layer may comprise a routing layer (i.e., containing a plurality of traces), and a second layer may comprise or consist essentially of a ground plane or a power supply (e.g., VDD) plane. Next, bond pads on a chip to be packaged can be mapped to external package connections (606). Such mapping can be done on a signal function basis, for example.

Further, such mapping may also include a prioritization whereby signals having higher performance requirements (e.g., input/output data signals or timing [e.g., reference clock] signal with relatively high switching rates) are given routing priority over relatively low performance signals. Also, some DC or static signals that require shielding from the capacitive coupling effects of other switching signals can also be indicated. Such signals can be given lower priority than the high performance/high switching signals, but higher priority than relatively static signals, such as control signals (e.g., chip enable, sleep mode control, etc.). In addition, some substrate layers can be fully or substantially dedicated to ground or power supply planes, for example. In one embodiment, traces can be routed in a ground plane by using a "cutaway" portion thereof, to further facilitate substrate trace routing. Such cutaway traces may be attached via a bond pad connector to an RDL or a bond pad, depending on design choices and/or preferences. Further, such mapping can be done with consideration for the signal routing within the PCB that the package (e.g. BGA) will be attached to. External package connection signal groups (e.g. controlled by memory controller bus) may have a preferable ordering to facilitate easy connection via the PCB traces to other packages on the same PCB (e.g., between a memory controller or a [micro] processor and a DRAM chip).

Locations on the substrate for placement of bond pad connectors for electrically connecting a bond pad to its corresponding external package connection are identified. Substrate trace routing can then be attempted (608), where the routing is done between bond pad connectors (e.g., bond wires), and external package connections (e.g., balls in a BGA package). If the substrate trace routing is sufficient (610), such as may be the case when "river routing" or no signal crossovers is attained, the flow can complete (612). However, when such signal crossovers are found, or the routing cannot be completed because signals would have to cross, then one or more new bond pad connection locations on the substrate can be identified (preferably such that the crossover is eliminated), and one or more RDLs can be routed from the bond pad to a connectable location on the uppermost surface of the chip (614). Then, another substrate trace routing can be performed utilizing the RDL connections to facilitate connections via the bond pad connectors and the external package connections (616).

Then, the trace and RDL routing can be checked again, and the flow can complete (612) if the trace and RDL routing are sufficient (618). However, if routing problems, such as when a number of trace ends that are not bondable to corresponding bond pads is greater than a number of bondable RDLs that can be routed to non-bondable bond pads, the number of predetermined substrate layers can be increased (620), and another substrate routing attempt can be made (608). Alternatively, a second or additional cycle of identifying connectable locations on the substrate and chip, and routing traces and RDLs, can be performed before adding an additional substrate layer.

Such a predetermined number of layers may be related to cost factors associated with the particular application. For example, for a very cost sensitive application, only one, two or possibly four layers of substrate routing may be sufficient, and the predetermined number or limit may be selected accordingly. However, in a higher performance application, the allowable or predetermined number of layers used in the substrate routing may be higher. Typically, an initial predetermined number setting (e.g., in 604) may be two, and an increase (e.g., in 620) may be from two to four layers, for example.

An exemplary method of making a packaged integrated circuit can include the steps of forming one or more redistribution layers on top of a chip; forming a substrate layer having a plurality of traces thereon; and connecting the plurality of traces to a plurality of bond pads on the chip and the one or more redistribution layers. Bond pad connectors (e.g., bond wires) can be used to make the connections between a substrate trace and a bond pad, or a substrate trace and an RDL.

In one embodiment, the step of forming the redistribution layer comprises forming one or more gold traces on the chip, and optionally, forming an insulator and/or passivation layer on the chip prior to forming the gold traces (in which case, the bond pads should remain exposed, or uncovered). In another embodiment, the step of connecting comprises wire bonding a plurality of bond wires between the plurality of substrate traces and the plurality of bond pads and the redistribution layer(s). Generally, one wire bond is attached at one end to a substrate trace and at the other end to a bond pad or the redistribution layer.

As discussed in part elsewhere herein, the step of forming the substrate layer may comprise forming the traces on a pre-impregnated composite fiber material, in which case forming the traces may comprise patterning and etching a copper (Cu) coating on the pre-impregnated composite fiber material. In the case of multiple routing layers in the substrate, vias between traces are formed conventionally.

Figure 7:
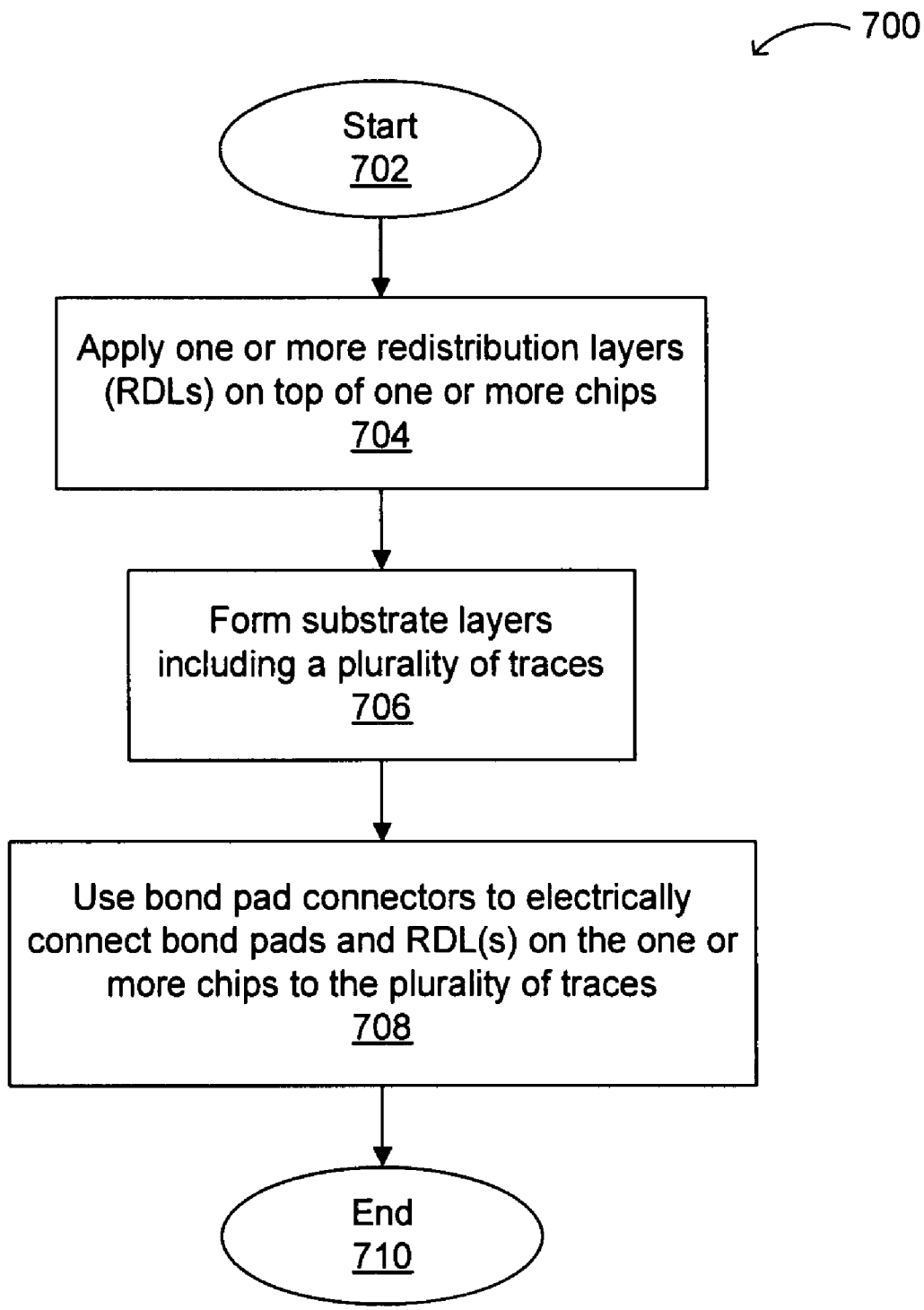
FIG. 7 is a flow diagram showing an exemplary method of making a packaged IC using an RDL in accordance with embodiments of the present invention.

Referring now to FIG. 7, a flow diagram showing an exemplary method of making a packaged IC using an RDL in accordance with embodiments of the present invention is indicated by the general reference character 700. The flow can begin (702) and one or more RDLs can be applied on top of one or more chips (704). Substrate layers that each includes a plurality of traces can then be formed (706). Such substrate layers comprise a pre-impregnated composite fiber material ("pre-preg") with a copper (Cu) coating (or foil) thereon, for example. The traces can be formed using relatively low resolution photolithography patterning and etching, as is known in the art. Next, bond pad connectors can be used to electrically connect the RDL(s) and bond pads on the chips to the plurality of traces (708), and the flow can complete (710). Additional, standard steps such as die encapsulation and testing have been left out, as they are well known in the art.

While the above examples include BGA packages, other types of packages (e.g., LCC packages) may also be used in accordance with embodiments. Further, one skilled in the art will recognize that other types of RDL materials may also be used in accordance with embodiments. Also, while bond "wires" have been shown in the examples above, substrate trace extensions, ribbons, or other forms of connection to chip bond pads may also be used in accordance with embodiments.

As one skilled in the art will recognize, any number of suitable packages and/or substrates can be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of electrically connecting a plurality of bond pads on one or more chips to a plurality of external package connections in an integrated circuit, the method comprising:
   routing a plurality of traces on a substrate, said substrate comprising one or more substrate layers and having the external package connections thereon, at least a first one of said plurality of traces being configured to electrically connect (i) a first bond pad connector from a first bond pad of said plurality of bond pads and (ii) a second bond pad connector from a second bond pad of said plurality of bond pads, and wherein a remaining subset of said plurality of traces being are configured to electrically connect a remaining plurality of bond pad connectors and said plurality of external package connections;
   forming a redistribution layer on one of said one or more chips, a layout view of said one of said one or more chips being bisected horizontally or vertically into a first side and a second side by a central axis, the redistribution layer electrically connecting a first bonding location on said first side of said one of said one or more chips to a second bonding location on said second side of said one of said one or more chips, wherein said redistribution layer and said first bond pad are on a first chip of said one or more chips; and
   connecting said plurality of bond pad connectors to said plurality of bond pads, said traces and said redistribution layer at said first and second bonding locations, wherein connecting said plurality of bond pad connectors and said redistribution layer comprises
      connecting said first bond pad connector to (i) said first bond pad and (ii) a first end of said first one of said plurality of traces,
      connecting said second bond pad connector to (i) a second end of said first one of said plurality of traces and (ii) a first end of said redistribution layer, and
      connecting a third bond pad connector to (i) a second end of said redistribution layer and (ii) a second one of said plurality of traces.

2. The method of claim 1, wherein:
   one of said one or more substrate layers comprises said plurality of traces; and
   connecting said plurality of bond pad connectors to said bond pads comprises
      connecting said first bond pad connector to (i) a first one of said plurality of traces and (ii) a first one of said bond pads on said first chip,
      connecting said second bond pad connector to (i) said first one of said plurality of traces and (ii) said first end of said redistribution layer, and
      connecting a third bond pad connector to (i) said second end of said redistribution layer and (ii) a second one of said plurality of traces.

3. The method of claim 2, wherein said first one of said plurality of traces is configured to facilitate placement of said redistribution layer to avoid an area on said first chip that is unavailable for said redistribution layer.

4. The method of claim 2, wherein each of said plurality of bond pad connectors includes a bond wire.

5. The method of claim 1, wherein said external package connections comprise a ball grid array (BGA).

6. The method of claim 5, wherein at least one of said one or more substrate layers comprises a leadless chip carrier (LCC).

7. A method of electrically connecting a plurality of bond pads on one or more chips to a plurality of external package connections in an integrated circuit, the method comprising:
   routing a plurality of traces on a substrate, said substrate comprising one or more substrate layers and having the external package connections thereon, at least a first one of said plurality of traces being configured to electrically connect (i) a first bond pad connector from a first bond pad of said plurality of bond pads and (ii) a second bond pad connector from a second bond pad of said plurality of bond pads, and wherein a remaining subset of said plurality of traces being are configured to electrically connect a remaining plurality of bond pad connectors and said plurality of external package connections;
   forming a redistribution layer on one of said one or more chips, a layout view of said one of said one or more chips being bisected horizontally or vertically into a first side and a second side by a central axis, the redistribution layer electrically connecting a first bonding location on said first side of said one of said one or more chips to a second bonding location on said second side of said one of said one or more chips; and
   connecting said plurality of bond pad connectors to said plurality of bond pads, said traces and said redistribution layer at said first and second bonding locations, wherein:
      one of said one or more substrate layers comprises said plurality of traces;
      said first bond pad is on a first chip of said one or more chips;
      said redistribution layer is on a second chip of said one or more chips; and
      connecting said plurality of bond pad connectors to said bond pads comprises
         connecting said first bond pad connector to (i) said first bond pad and (ii) a first end of said one of said plurality of traces,
         connecting said second bond pad connector to (i) a first end of said redistribution layer and (ii) a second end of said one of said plurality of traces, and
         connecting a third bond pad connector to (i) said a second end of said redistribution layer and (ii) a second one of said plurality of traces.

8. The method of claim 7, wherein said first one of said plurality of traces is configured to facilitate placement of said redistribution layer to avoid an area on said second chip that is unavailable for said redistribution layer.

9. The method of claim 7, wherein each of said plurality of bond pad connectors includes a bond wire.

10. A method of electrically connecting a plurality of bond pads on one or more chips to a plurality of external package connections in an integrated circuit, the method comprising
   routing a plurality of traces on a substrate, said substrate comprising one or more substrate layers and having the external package connections thereon, at least a first one of said plurality of traces being configured to electrically connect (i) a first bond pad connector from a first bond pad of said plurality of bond pads, said first bond pad on a first chip of said one or more chips, (ii) a second bond pad connector from a second bond pad of said plurality of bond pads, and (iii) a third bond pad connector from a third bond pad of said plurality of bond pads, each of said plurality of bond pad connectors include a bond wire, wherein a remaining subset of said plurality of traces are configured to electrically connect a remaining plurality of bond pad connectors and said plurality of external package connections;

forming a redistribution layer on one of said one or more chips, a layout view of said one of said one or more chips being bisected horizontally or vertically into a first side and a second side by a central axis, the redistribution layer electrically connecting a first bonding location on said first side of said one of said one or more chips to a second bonding location on said second side of said one of said one or more chips;

connecting said first bond pad connectors to (i) said first bond pad, on said first chip and (ii) a first end of said one of said plurality of traces and said redistribution layer at said first and second bonding locations;

connecting said second bond pad connector to (i) a second end of a first one of said plurality of traces, wherein said first one of said plurality of traces is configured to facilitate placement of said redistribution layer to avoid an area on said second chip of said one or more chips that is unavailable for said redistribution layer, and (ii) a first bond pad on said second chip; and connecting said third bond pad connector to (i) a second one of said plurality of traces and (ii) said second end of said redistribution layer.

11. The method of claim 10, wherein routing said plurality of traces comprises forming said plurality of traces on one of said one or more substrate layers, each trace connecting a location to which one of said bond pad connectors is to be connected to one of said external package connections.

12. The method of claim 10, wherein said external package connections comprise a ball grid array (BGA).

13. The method of claim 10, wherein at least one of said one or more substrate layers comprises a leadless chip carrier (LCC).

14. The method of claim 10, wherein forming said redistribution layer comprises forming one or more gold traces on a top surface of said first chip.

15. The method of claim 10, wherein routing said plurality of traces comprises forming said plurality of traces on a pre-impregnated composite fiber material.

16. The method of claim 15, wherein forming the plurality of traces comprises patterning and etching a copper (Cu) coating on the pre-impregnated composite fiber material.

17. The method of claim 10, wherein connecting comprises (i) wire bonding a plurality of bond wires between a subset of the plurality of traces and a corresponding subset of the plurality of bond pads, and (ii) wire bonding a separate bond wire between a remaining one of the plurality of traces and the first end of the redistribution layer.

18. The method of claim 10, wherein said redistribution layer is configured to maintain said plurality of substrate layers at less than or equal to a predetermined number.

19. The method of claim 18, wherein said predetermined number is 4.

20. The method of claim 19, wherein:
a first layer of said predetermined number of substrate layers comprises a routing layer containing said plurality of traces; and
a second layer of said predetermined number of substrate layers comprises a ground plane or a power supply plane.

21. The method of claim 20, wherein:
said second layer of said predetermined number of substrate layers comprises said ground plane; and
a third layer of said predetermined number of substrate layers comprises said power supply plane.

22. The method of claim 20, wherein said predetermined number is 2.

23. The method of claim 10, wherein forming said redistribution layer comprises forming one or more gold traces on a top surface of said second chip.

* * * * *